United States Patent [19]

Ogata

[11] 4,027,174
[45] May 31, 1977

[54] DYNAMIC DECODER CIRCUIT

[75] Inventor: Yoshihiro Ogata, Zama, Japan

[73] Assignee: Toko Incorporated, Tokyo, Japan

[22] Filed: June 30, 1976

[21] Appl. No.: 701,125

[30] Foreign Application Priority Data

July 4, 1975  Japan .............................. 50-81919

[52] U.S. Cl. ............................... 307/205; 307/215;
307/251; 307/270; 307/DIG. 5; 340/173 R
[51] Int. Cl.² ................. H03K 19/08; H03K 19/34;
G11C 8/00; G11C 15/04
[58] Field of Search .......... 307/205, 215, 238, 251,
307/270, 255, DIG. 5, 269; 340/173 R

[56] References Cited

UNITED STATES PATENTS

| | | | |
|---|---|---|---|
| 3,644,904 | 2/1972 | Baker ............................ | 307/238 X |
| 3,717,868 | 2/1973 | Crawford et al. ............. | 307/205 X |
| 3,778,784 | 12/1973 | Karp et al. ..................... | 307/238 X |
| 3,786,437 | 1/1974 | Croxon et al. ................. | 340/173 R |
| 3,848,237 | 11/1974 | Geilhufe et al. ............... | 307/238 X |
| 3,900,742 | 8/1975 | Hampel et al. ................ | 307/205 X |
| 3,959,781 | 5/1976 | Mehta et al. .................. | 307/DIG. 5 X |

OTHER PUBLICATIONS

Cox et al., "An FET 4-Phase Dynamic Off-Chip Driver with Polarity Hold"; *IBM Tech. Discl. Bull.*; vol. 17, No. 2, pp. 466–467; July 1974.

*Primary Examiner*—John S. Heyman
*Assistant Examiner*—Larry N. Anagnos

[57] ABSTRACT

A dynamic decoder circuit including at least first, second and third complementary MOS transistor circuits designed to minimize power consumption and able to produce high output signal levels. The first circuit comprises a first MOS transistor of a first channel type and a plurality of second MOS transistors of a second channel type having the drains thereof connected to that of the first MOS transistor, wherein address signal or signals are selectively applied to the gates of the second MOS transistors and a first timing signal is imparted to the gate of the first MOS transistor. The second circuit comprises a third MOS transistor of the second channel type and a fourth MOS transistor of the first channel type having the drain thereof connected to that of the third MOS transistor, the gate of the third MOS transistor being coupled to the connection point between the drain of said first transistor and those of the second MOS transistors, wherein said first timing signal is imparted to the gate of the fourth MOS transistor and a second timing signal is applied to the source of the third MOS transistor. The third circuit comprises a fifth MOS transistor of the first channel type and a sixth MOS transistor of the second channel type having the drain thereof connected to that of the fifth MOS transistor, the gate of the fifth MOS transistor being coupled to the connection point between the drain of the third MOS transistor and that of the fourth MOS transistor, wherein a third timing signal is imparted to the gate of the sixth MOS transistor, and the output of the decoder circuit is available at the connection point between the drain of the fifth MOS transistor and that of the sixth MOS transistor.

4 Claims, 8 Drawing Figures 4,027,174

1

DYNAMIC DECODER CIRCUIT

BACKGROUND OF THE INVENTION

1. Field of the Invention

This invention relates to a dynamic decoder circuit, and more particularly it pertains to such a circuit comprising complementary MOS transistor circuits.

2. Description of the Prior Art

There have heretofore been proposed various decoder circuits comprising MOS transistors of the same channel type. However, such conventional decoder circuits are disadvantageous, among others, in that there is great power loss and high speed operation can hardly be achieved.

SUMMARY OF THE INVENTION

Accordingly, it is an object of this invention to provide a dynamic decoder circuit comprising complementary MOS transistor circuits.

Another object of this invention is to provide such a circuit which is designed so that power consumption can be minimized and yet high output can be produced.

Still another object of this invention is to provide such a circuit which is designed so that high speed operation can be achieved.

A further object of this invention is to provide such a circuit which is designed that adverse effect of noise thereon can be eliminated.

A still further object of this invention is to provide such a circuit which is designed so that erroneous operation can be prevented from occurring.

Other objects, features and advantages of this invention will become apparent from the following description taken in conjunction with the accompanying drawings.

BRIEF DESCRIPTION OF THE DRAWINGS

FIG. 4 is a view showing on an enlarged scale part of the pulse waveforms shown in FIG. 3, wherein

DESCRIPTION OF THE PREFERRED EMBODIMENTS

Figure 1A:
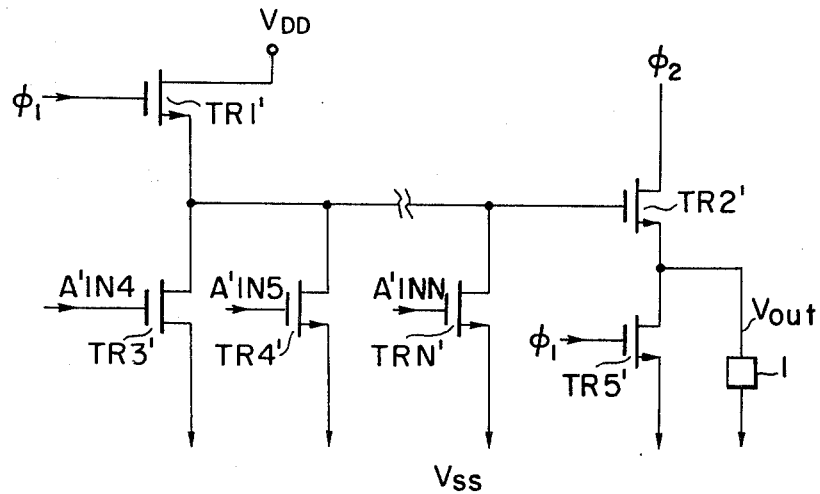
FIG. 1A and 1B are views showing the conventional decoder circuits, respectively.

In order to give a better understanding of this invention, description will first be made of the conventional decoder circuits shown in FIGS. 1A and 1B. In FIG. 1A, $\phi 1$ and $\phi 2$ represent timing signals, and A′IN4, . . ., A′INN denote address signals available from address buffers of an electronic computer. $V_{DD}$ is a high voltage such as power source voltage, and $V_{SS}$ is a low voltage such as earth potential. Numeral 1 indicates a load. TR1′ to TRN′ are enhancement type N channel MOS transistors.

In the foregoing circuit arrangement, the output voltage $V_{out}$ of the decoder circuit is controlled by the transistor TR2′, but a voltage drop approximately equal to the threshold level of this transistor is produced between the drain and source electrodes thereof so that even when the high voltage $V_{DD}$ is applied to the gate thereof, the resulting output voltage $V_{out}$ is as low as the high voltage $V_{DD}$ minus the aforementioned voltage drop.

Figure 1B:
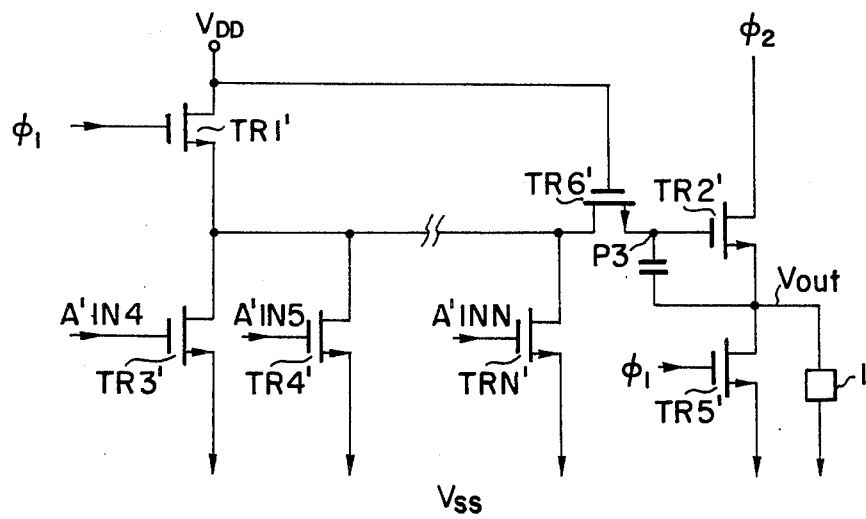

In an attempt to compensate for such a voltage drop, there has been proposed a circuit such as shown in FIG 1B wherein the so-called boot strap method is employed to apply to the gate of the transistor TR2′ a voltage higher than the high voltage $V_{DD}$. With such a circuit arrangement, however, it is required that transistors TR6′ and TR2′ connected to connection point P3 have a very high breakdown voltage, which often causes these and/or other transistors to be damaged. Moreover, it is also required that the breakdown voltage of the transistor TR2′ be particularly high since the timing signal $\phi 2$ is also applied to the load 1 through this transistor.

Obviously, the aforementioned drawbacks of the prior art decoder circuits will constitute great disadvantages when the output voltages of such decoder circuits are to be employed also for the purpose of driving and/or controlling other circuits.

In accordance with this invention, there is provided a novel and improved dynamic decoder circuit which is free from the foregoing drawbacks of the prior art and which is adapted to provide a high output voltage and operate at a high speed with only a small power consumption.

Figure 2:
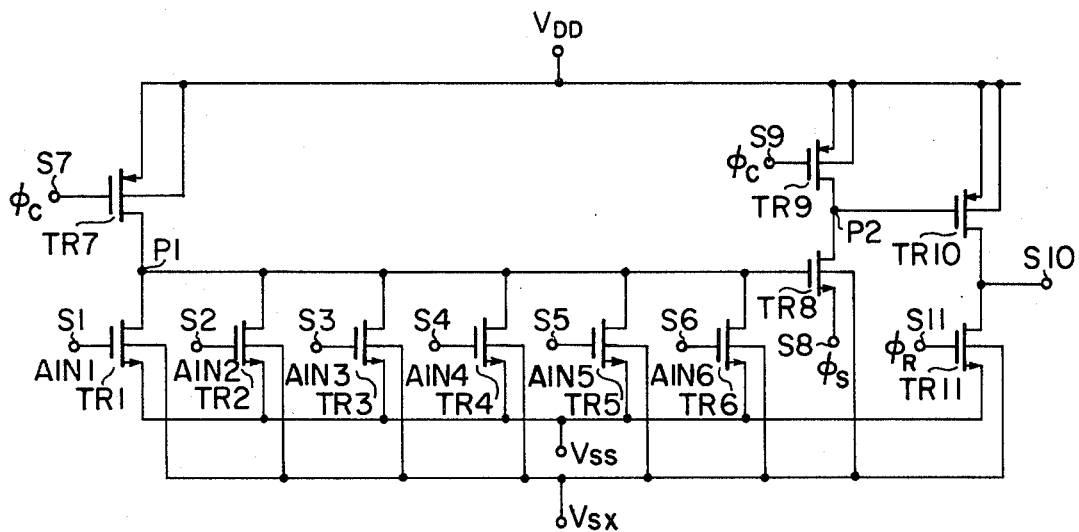
FIG. 2 is a view showing the dynamic decoder circuit according to an embodiment of this invention.

Referring now to FIG. 2, there is shown the dynamic decoder circuit according to an embodiment of this invention, wherein references TR1 to TR11 represent enhancement type MOS transistors, respectively. This circuit comprises a first complementary MOS circuit (referred to simply as CMOS circuit hereinafter) which is constituted by the P channel MOS transistor TR7 and N channel MOS transistors TR1 to TR6, a second CMOS circuit formed by the P channel MOS transistor TR9 and N channel MOS transistor TR8, and a third CMOS circuit formed by the P channel MOS transistor TR10 and N channel MOS transistor TR11. In the first CMOS circuit, the P channel MOS transistor TR7 and N channel MOS transistors TR1 to TR6 have their drains connected with each other at a connection point P1. In the second CMOS circuit, the N channel MOS transistor TR8 has the gate thereof coupled to the connection point P1 of the first CMOS circuit and the drain thereof connected with that of the P channel MOS transistor TR9 at a connection point P2. In the third CMOS circuit, the P channel MOS transistor TR10 has the gate thereof coupled to the connection point P2 of the second CMOS circuit and the drain thereof connected with that of the N channel MOS transistor TR11. The P channel MOS transistors of the first, second and third CMOS circuits have their sources connected to a high voltage source $V_{DD}$, whereas the N channel MOS transistors TR1 to TR6 of the first CMOS circuit and the N channel MOS transistor of the thrid CMOS circuit have their sources connected to a low voltage source $V_{SS}$. Furthermore, the substrates of all the P channel MOS transistors are also connected to the high voltage source $V_{DD}$, while the substrates of all the N channel MOS transistors are connected to a voltage source $V_{SX}$ equal to or slightly lower than the low voltage $V_{SS}$. Terminals S1 to S6 are led out of the gates of the N channel MOS transistors TR1 to TR6, respectively, and a terminal S7 is led out of the gate of the P channel MOS transistor TR7; a terminal S8 is led out of the source of the N channel MOS transistor TR8, and a terminal S9 is led out of the gate of the P channel MOS transistor TR9; and an output terminal S10 is led out of the connection point between the drains of the MOS transistors TR10 and TR11 of the third CMOS circuit. As will readily be appreciated, the first CMOS circuit mentioned above constitutes a NOR circuit wherein the connection point P1 serves as an output terminal thereof. The aforementioned circuit arrangement may be constructed in the form of an integrated circuit in a common chip including memory arrays.

Figure 3:
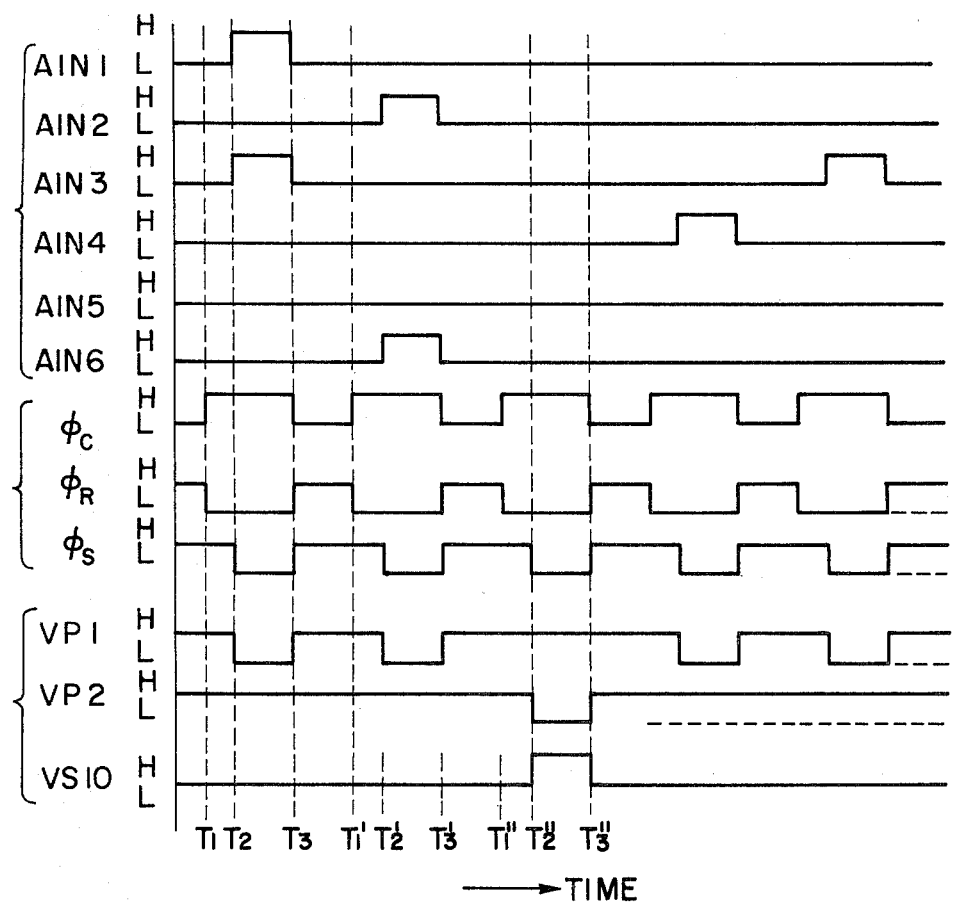
FIG. 3 is a view showing pulse waveforms useful for explaining the operation of the dynamic decoder circuit shown in FIG. 2.
Figure 4A:
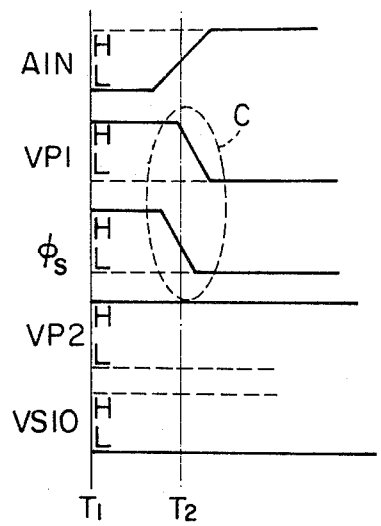
FIG. 4A shows the case where one or more of the address signals as applied are of a high level.
Figure 4B:
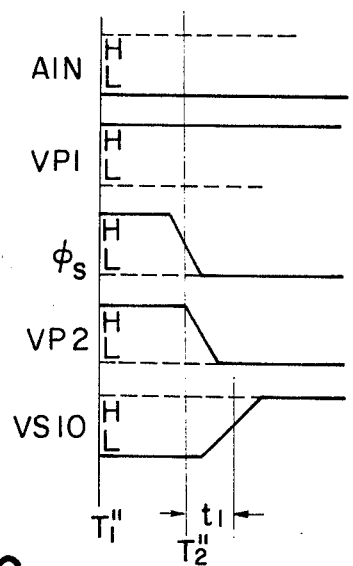
FIG. 4B shows the case where all of the address signals as applied are of a low level.

Description will now be made, by way of example, of the case where the present decoder circuit is employed for the purpose of addressing locations of memory arrays (not shown), with reference to FIGS. 3 and 4 which illustrate pulse waveforms.

Prior to a point of time $T_1$, all address signals AIN1 to AIN6 fed from address buffers (not shown) to the terminals S1 to S6 respectively are of a low level, so that the respective transistors TR1 to TR6 are rendered non-conductive, whereas the transistor TR7 is rendered conductive since a timing signal $\phi C$ supplied to the terminal S7 is of a low level. Thus, the connection point P1 is charged with a potential VP1 of a high level corresponding to the high voltage $V_{DD}$. Though this high level potential VP1 is applied to the gate of the transistor TR8, the latter is in the "off" state due to the fact that the timing signal $\phi S$ applied to the source of the transistor TR8 via the terminal S8 is of a high level and the connection point P2 is charged with a potential VP2 of a high level since the transistor TR9 is rendered conductive by being provided with the low level timing signal $\phi 1$. The transistor TR10 is also rendered non-conductive due to the high level of the potential VP2 at the connection point P2, while the transistor TR11 is rendered conductive by being provided with a timing signal $\phi R$ of a high level, so that the output terminal S10 is of a low level corresponding to the low voltage $V_{SS}$.

Immediately after the point of time $T_1$, the timing signals $\phi C$ and $\phi R$ are reversed so that all of the transistors TR7, TR9 and TR11 which have been in the "on" state prior to $T_1$ are turned off; however, the conditions which have been prevailing prior to $T_1$ are still dynamically maintained at the connection points P1, P2 and the output terminal S10 due to parasitic capacitances thereat. The address signals AIN1 to AIN6 are applied to the terminals S1 to S6 respectively as mentioned above. With regard to the manner in which such address signals are applied, however, it can be classified into two different cases: one of the cases is such that when applied, one or more of the address signals are of the high level, and the other case is such that when applied, all the address signals are of the low level. The condition at the point of time $T_2$ corresponds to the former case, wherein two of the address signals, AIN1 to AIN3 is of the high level in this example, as will be seen from FIG. 3. Thus, at the point of time $T_2$, the transistors TR1 and TR3 are turned on, so that the high-level potential charged at the connection point P1 is discharged through these transistors so that the potential thereat is dropped down to the low level. The terminal S8 is provided with timing signal $\phi S$ of low level at substantially the same point time as the address signals AIN1 and AIN3, but in this case, the voltage between the connection point P1 and the terminal S8 is selected not to exceed the threshold level of the transistor TR8. Hence, the transistor TR8 will not be turned on, so that the potential at the connection point P2 will be maintained at high level. And yet, the transistor TR10 will not be turned on, either. Thus, a low-level potential corresponding to the low voltage $V_{SS}$ will be maintained at the output terminal S10. At a point of time $T'_2$, address signals AIN2 and AIN6 are applied to the terminals S2 and S6 respectively. In this case, the present circuit will operate in exactly the same manner as it did at the point of time $T_2$. The condition occurring at a point of time $T''_2$ corresponds to the aforementioned other case, that is the case where all of the address signals AIN1 to AIN6 applied are of the low level. Thus, all of the transistors TR1 to TR6 are in the "off" state, so that the potential VP1 at the connection point P1 will be maintained at the high level. If timing signal $\phi S$ of low level is applied so that the voltage between the connection point P2 and the terminal S8 exceeds the threshold level of the transistor TR8, then the latter will be turned on at a point of time when said voltage becomes higher than said threshold level, so that the high-level potential VP2 at the connection point P2 will be discharged so as to be dropped down to the low level. The resultant low-level potential VP2 will be applied to the gate of the transistor TR10 so as to cause the latter to be turned on, so that potential VS10 at the output terminal S10 will be caused to assume a high level corresponding to the high voltage $V_{DD}$.

As will be readily appreciated from what has been described above, the decoder circuit according to this invention is arranged so that the potential at the output terminal S10 is maintained at the low level when one or more of the address signals AIN1 to AIN6 are of the high level, whereas when all of the address signals are of the low level. the potential at the output terminal is of the high level.

Figure 4C:
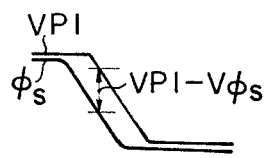
FIG. 4C shows the timing relationship between the timing signal $\phi S$ and the potential VP1 shown in FIG. 4A.

One of the most important advantages of the present dynamic decoder circuit is that the same can operate at a high speed. This will now be explained with reference to FIG. 4 which shows, on an enlarged scale, part of the timing relationship between the pulses as shown in FIG. 3. When one or more of the address signals AIN1 to AIn6 are applied to this circuit, the potential VP1 at the connection point P1 is discharged so as to be of the low level, as will be seen from FIG. 4A. At this point, there is no necessity for the timing pulse to wait until the potential VP1 assumes the low level. More specifically, the timing signal $\phi S$ can be applied, subsequent to the address signals, at any point of time within such a time range that the difference between the potential VP1 at a given time and the potential $V\phi S$ of the timing signal $\phi S$ at the time does not exceed the threshold level of the transistor TR8 so that the latter is not turned on, as will be appreciated from FIG. 4C showing that portion of FIG. 3 which is enclosed by a dotted line C. In case all the address signals are of the low level when applied, then the potential VP2 at the connection point P2 will be discharged so as to be of the low level, as will be seen from FIG. 4B. This discharge will be initiated at a point of time when the timing signal $\phi S$ is applied so that the difference between the potential at the terminal S8 exceeds the threshold level of the transistor TR8. Similarly, the potential VS10 at the output terminal S10 will also be discharged through the transistor TR10. In this way, it is possible to minimize the time difference $t_1$ (FIG. 4B) between the point when the potential VP2 at the connection point P2 begins to fall and the rise time of the potential VS10 at the output terminal S10.

Furthermore, the present decoder circuit is advantageous in that power consumption can be minimized. More specifically, since each of the terminals to which the timing signals are applied has only a small capacitance, the timing signal source does not have to be so powerful as in the conventional decoder circuits. Still another advantage of the present dynamic decoder circuit resides in that since no DC current is caused to flow from the high voltage source $V_{DD}$ to the low voltage source $V_{SS}$, it is only when the connection points P1, P2 and output terminal S10 are charged through the P channel MOS transistors that the power source is consumed.

With the foregoing circuit arrangement of this invention, the conductance of each of the CMOS circuits is increased by virtue of the fact that the P channel transistors have their substrates and sources connected to the high voltage source $V_{DD}$ and the N channel transistors have their substrates and sources connected to a voltage substantially equal to the low voltage $V_{SS}$. Thus, there occurs no drop in the threshold voltage between the source and the drain of each transistor as is the case with the conventional circuits constituted by MOS transistors of the same channel type. Moreover, the circuit of this invention is so designed that the low level or high level potential obtained at the connection point of a preceding CMOS circuit is applied, without any wastage, to the gate of a transistor of the succeeding CMOS circuit. Obviously, this implies that such advantageous properties of a CMOS circuit that power loss is minimized and operating speed is increased, are successfully utilized in this invention.

Figure 5:
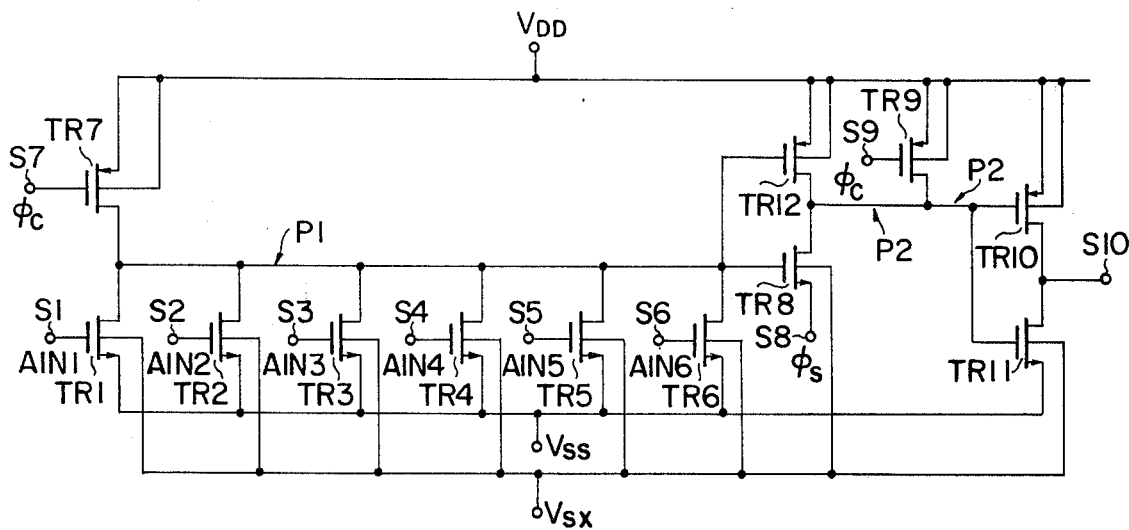
FIG. 5 is a view showing the dynamic decorder circuit according to another embodiment of this invention.

Referring to FIG. 5, there is illustrated another embodiment of this invention, which is different from the embodiment shown in FIG. 2 in that an additional P channel MOS transistor TR12 is provided which has the substrate and source thereof connected to the high voltage source $V_{DD}$, the drain thereof connected to that of the transistor TR8 and the gate thereof connected to the connection point P1, and in that the gate of the transistor TR11 is coupled to the connection point P2.

With the arrangement of FIG. 5, it is possible to prevent the potential at the connection point P2 from being dropped due to field-through effect, by virtue of the fact that the transistor TR12 is turned on by the level of the potential at the connection point P1 which is discharged when one or more of the address signals as applied are of the high or "1" level, so that the output terminal S10 can be maintained at the level of the low voltage $V_{SS}$. As described above, in this embodiment, the transistor TR11 has its gate connected to the connection point P3 so as to constitute a common gate inverter, together with the transistor TR10. Thus, since the margin of an input voltage for such a common gate inverter is great as is known in the art, there will be no possibility that a rising level occurs at the output terminal S10 even if the potential at the connection point P2 exceeds the threshold level of the P channel MOS transistor TR10, provided that the said potential is within the said margin. In addition, the terminal S10 corresponds to the output terminal of the aforementioned common gate inverter and is always under a static condition, that is, under such a condition that the terminal S10 is coupled to a fixed level such as $V_{DD}$ or $V_{SS}$ through resistive impedance such as channel resistance of MOS transistor, and the transistor TR11 is always in the "on" state when the potential available at the output terminal is of the low level. Thus, noise tending to come to the output terminal S10 can be absorbed at the voltage source $V_{SS}$ through the MOS transistors. It will be readily apparent to those skilled in the art that it is possible that the transistor TR12 may be provided without connecting the gate of the transistor TR11 to the connection point P2, and that it is also possible that the last-mentioned connection may be made without providing the transistor TR12.

While preferred embodiments of this invention have been described in detail, it will be apparent to those skilled in the art that the invention may be embodied otherwise without departing from its spirit and scope. For example, it is of course possible that the transistors TR7, TR9, TR10 and TR12 may be of the N channel type and the transistors TR1 to TR6, TR8 and TR11 may be of the P channel type.

I claim:
1. A dynamic decoder circuit which comprises:
   a. a first complementary MOS transistor circuit means including a first MOS transistor of a first channel type and a plurality of second MOS transistors of a second channel type having the drains thereof connected to the drain of said first MOS transistor, wherein address signal or signals are selectively applied to the gates of said second MOS transistors and a first timing signal is imparted to the gate of said first MOS transistor;
   b. a second complementary MOS transistor circuit means including a third MOS transistor of said second channel type and a fourth MOS transistor of said first channel type having a drain thereof connected to that of said third MOS transistor, the gate of said third MOS transistor being coupled to the connection point between the drain of said first MOS transistor and those of said second MOS transistors, wherein said first timing signal is imparted to the gate of said fourth MOS transistor and a second timing signal is applied to the source of the third MOS transistor; and
   c. a third complementary MOS transistor circuit means including a fifth MOS transistor of said first channel type and a sixth MOS transistor of said second channel type having the drain thereof connected to that of said fifth MOS transistor, the gate of said fifth MOS transistor being coupled to the connection point between the drain of said third MOS transistor and that of said fourth MOS transistor, wherein a third timing signal is imparted to the gate of said sixth MOS transistor, and the output of said dynamic decoder circuit is available at the connection point between the drain of said fifth MOS transistor and that of said sixth MOS transistor.

2. A dynamic decoder circuit according to claim 1, further comprising a seventh MOS transistor of said first channel type having the drain thereof connected to that of said third MOS transistor and the gate thereof coupled to the connection point between the drain of said first MOS transistor and those of said second MOS transistors.

3. A dynamic decoder circuit according to claim 2, wherein the gate of said sixth MOS transistor is coupled to the connection point between the drain of said third MOS transistor and that of said fourth MOS transistor.

4. A dynamic decoder circuit according to claim 1, wherein the gate of said sixth MOS transistor is coupled to the connection point between the drain of said third MOS transistor and that of said fourth MOS transistor.

* * * * *